(12) United States Patent
Weigold (10) Patent No.: US 7,863,069 B2
(45) Date of Patent: Jan. 4, 2011

(54) METHOD OF FORMING AN INTEGRATED MEMS RESONATOR

(75) Inventor: Jason W. Weigold, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 316 days.

(21) Appl. No.: 11/535,698

(22) Filed: Sep. 27, 2006

(65) Prior Publication Data

US 2007/0072327 A1 Mar. 29, 2007

Related U.S. Application Data

(60) Provisional application No. 60/720,733, filed on Sep. 27, 2005, provisional application No. 60/720,810, filed on Sep. 27, 2005.

(51) Int. Cl.
*H01L 21/00* (2006.01)

(52) U.S. Cl. ............................... 438/50; 438/48; 438/53

(58) Field of Classification Search ................. 333/227; 438/50, 48, 53
See application file for complete search history.

(56) References Cited

U.S. PATENT DOCUMENTS

| | | | | |
|---|---|---|---|---|
| 5,798,283 | A * | 8/1998 | Montague et al. | 438/24 |
| 5,963,788 | A * | 10/1999 | Barron et al. | 438/48 |
| 6,136,630 | A * | 10/2000 | Weigold et al. | 438/50 |
| 6,393,913 | B1 | 5/2002 | Dyck et al. | |
| 6,429,755 | B2 | 8/2002 | Speidell et al. | |
| 6,440,766 | B1 * | 8/2002 | Clark | 438/52 |
| 6,531,331 | B1 * | 3/2003 | Bennett et al. | 438/48 |
| 6,611,033 | B2 * | 8/2003 | Hsu et al. | 257/414 |
| 6,894,576 | B2 | 5/2005 | Giousouf et al. | |
| 6,894,586 | B2 | 5/2005 | Bircumshaw et al. | |
| 6,909,221 | B2 | 6/2005 | Ayazi et al. | |
| 6,985,051 | B2 | 1/2006 | Nguyen et al. | |
| 7,023,065 | B2 * | 4/2006 | Ayazi et al. | 257/414 |
| 7,098,757 | B2 | 8/2006 | Avazi et al. | |
| 7,119,636 | B2 | 10/2006 | Nguyen et al. | |
| 7,227,432 | B2 | 6/2007 | Lutz et al. | |
| 7,248,131 | B2 * | 7/2007 | Fazzio et al. | 333/187 |
| 7,295,088 | B2 | 11/2007 | Nguyen et al. | |
| 7,319,372 | B2 | 1/2008 | Pan et al. | |

(Continued)

OTHER PUBLICATIONS

Single-Mask Reduced-Gap Capacitive Micromachined Devices Reza Abdolvand and Farrokh Ayazi School of Electrical and Computer Engineering Georgia Institute of Technology, Atlanta, USA, IEEE 2005.

(Continued)

*Primary Examiner*—Thanh V Pham
*Assistant Examiner*—Caleb Henry
(74) *Attorney, Agent, or Firm*—Sunstein Kann Murphy & Timbers LLP (57) ABSTRACT

A method of producing an integrated MEMS resonator includes providing a substrate including single crystal silicon and partially forming a resonator in a first portion of the substrate, the resonator having a resonating element formed by the substrate and an electrode, the resonating element and the electrode forming a variable capacitor. The method also includes forming circuitry in a second portion of the substrate, the circuitry configured for detecting capacitance of the variable capacitor and finish forming the resonator and integrating the resonator with the circuitry so that the electrode is in communication with the circuitry.

11 Claims, 7 Drawing Sheets

U.S. PATENT DOCUMENTS

| | | |
|---|---|---|
| 7,323,952 B2 | 1/2008 | Pan et al. |
| 2004/0065940 A1 | 4/2004 | Ayazi et al. |
| 2007/0070821 A1 | 3/2007 | Weigold |
| 2007/0103258 A1 | 5/2007 | Weinstein et al. |

OTHER PUBLICATIONS

SOI-Based HF and VHF Single-Crystal Silicon Resonators With Sub-100 Nanometer Vertical Capacitive Gaps, Siavash Pourkamali and Farrokh Ayazi School of Electrical and Computer Engineering, Georgia Institute of Technology, Atlanta, GA 30332-0250 The 12th International Conference on Solid State Sensors, Actuators and Microsystems, Boston, Jun. 8-12, 2003.

High-Q Single Crystal Silicon HARPSS Capacitive Beam Resonators With Self-Aligned Sub-100-nm Transduction Gaps, Siavash Poukamali, Akinori Hasimura, Reza Abdolvand, Gavin K. Ho, Ahmet Erbil and Farrokh Ayazi Journal of Microelectromechanical Systems, vol. 12, No. 4, Aug. 2003.

High Frequency Capacitive Micromechanical Resonators With Reduced Motional Resistance Using the HARPSS Technology; Siavash Pourkamali and Farrokh Ayazi School of Electrical and Computer Engineering, Georgia Institute of Technology, Atlanta, GA 30332-0250 2004 Topical Meeting on Silicon Monolithic Integrated Circuits in RF Systems.

VHF Single Crystal Silicon Capacitive Elliptic Bulk-Mode Disk Resonators—Part II: Implementation and Characterization Siavash Pourkamali, Zhili Hao and Farrokh Ayazi Journal of Microelectromechanical Systems, vol. 13, No. 6, Dec. 2004.

* cited by examiner

METHOD OF FORMING AN INTEGRATED MEMS RESONATOR

CROSS-REFERENCE TO RELATED APPLICATIONS

This patent application claims priority under 35 U.S.C. §119(e) to U.S. Provisional Patent Application No. 60/720,733 filed Sep. 27, 2005, entitled METHOD OF FORMING A MEMS RESONATOR and to U.S. Provisional Patent Application No. 60/720,810 filed Sep. 27, 2005, entitled MEMS RESONATOR, the disclosures of which are incorporated by reference herein in their entirety.

FIELD OF THE INVENTION

The invention generally relates to MEMS resonators and, more particularly, the invention relates integrated MEMS resonators and methods of producing same.

BACKGROUND OF THE INVENTION

Electronic clocking circuits are used in a wide variety of applications. For example, many solid state electronic devices (e.g., microprocessors) operate at a rate set by an internal or external clocking circuit. Accordingly, the accuracy of the clocking signal generated by a clocking circuit generally is critical to the proper operation of the underlying device being clocked. Many devices thus use conventional crystal oscillators to clock their underlying processes.

Crystal oscillators, however, have a number of drawbacks. Among others, stable crystal oscillators typically are relatively large and expensive. Microelectromechanical systems (MEMS) resonators have been developed in an attempt to reduce the size requirements currently needed for crystal oscillators. However, oscillators or resonators typically have associated circuitry that detects the oscillations or deflections of the resonating structure and transmits such deflections to other circuitry for further processing. Forming such circuitry on the same wafer or die as a MEMS resonator, however, generally presents a number of challenges.

SUMMARY OF THE INVENTION

In accordance with one aspect of the invention, a method of producing a MEMS resonator includes providing a substrate comprising single crystal silicon and partially forming a resonator in a first portion of the substrate, the resonator having a resonating element formed by the substrate and an electrode, the resonating element and the electrode forming a variable capacitor. The method also includes forming circuitry in a second portion of the substrate, the circuitry configured for detecting capacitance of the variable capacitor and finish forming the resonator and integrating the resonator with the circuitry so that the electrode is in communication with the circuitry.

In accordance with related embodiments, the substrate may be a silicon-on-insulator wafer. Partially forming the resonator may include high temperature processes of forming the resonator. The electrode may be formed from polysilicon. The electrode may be formed by etching a trench in the substrate and adding the polysilicon to the trench. The method may further include forming oxide along surfaces of the trench before adding the polysilicon to the trench and removing the oxide to form an electrostatic gap between the resonating element and the electrode. The resonating element may be formed by removing a portion of the substrate to form an outer diameter of the resonating element in the same step as removing a portion of the substrate to form an inner diameter of the resonating element. Integrating the resonator with the circuitry may include forming metal contacts to the circuitry, the electrode, and the substrate. A MEMS resonator may be formed according to this method.

In accordance with another aspect of the invention, a method of forming a MEMS resonator includes providing a substrate comprising single crystal silicon and forming a resonating element in a first portion of the substrate. The method also includes forming an electrode adjacent to the resonating element, the electrode and the resonating element forming a variable capacitor and fabricating circuitry on a second portion of the substrate, the circuitry being in communication with the electrode for detecting capacitance of the variable capacitor.

In accordance with related embodiments, the substrate may be a silicon-on-insulator wafer. The high temperature processes may at least in part form the electrode and fabricating circuitry may be performed after the high temperature processes of forming the electrode. The electrode may be formed from polysilicon.

In accordance with another aspect of the invention, a method of forming a MEMS resonator includes providing a substrate including single crystal silicon, forming a trench in a first portion of the substrate, adding material to the trench to form an electrode of the resonator, and forming circuitry on a second portion of the substrate. The method may also include forming metal contacts to the circuitry, the material, and the substrate, forming a resonating element in the substrate and releasing the resonating element and a portion of the electrode from the substrate.

In accordance with related embodiments, the method may further include forming oxide along surfaces of the trench before adding the material to the trench. Releasing the resonating element may include removing the oxide between the resonating element and the electrode to form an electrostatic gap. The substrate may be a silicon-on-insulator wafer. Forming a resonating element may be performed contemporaneously with forming the trench. The method may further include etching a space between the material and the substrate to form electrostatic gaps between the resonating element and the electrode. The steps of the method may be performed in any order so long as high temperature processes of forming the resonator are performed before forming the circuitry.

BRIEF DESCRIPTION OF THE DRAWINGS

The foregoing advantages of the invention will be appreciated more fully from the following further description thereof with reference to the accompanying drawings wherein.

DESCRIPTION OF ILLUSTRATIVE EMBODIMENTS

Embodiments of the present invention provide an integrated MEMS resonator and method of producing same that has both resonator structure and circuitry formed on a single crystal silicon wafer. The method includes partially forming a MEMS resonator using high temperature processes and then forming the circuitry on the wafer or die. The remaining steps of forming the MEMS resonator and integrating the resonator structure with the circuitry are then performed at lower temperature processes. This ensures the integrity of the circuitry, which may become damaged at high processing temperatures, thus enabling the MEMS resonator and the circuitry to be formed on the same wafer or die. Details of illustrative embodiments are discussed below.

Figure 1:
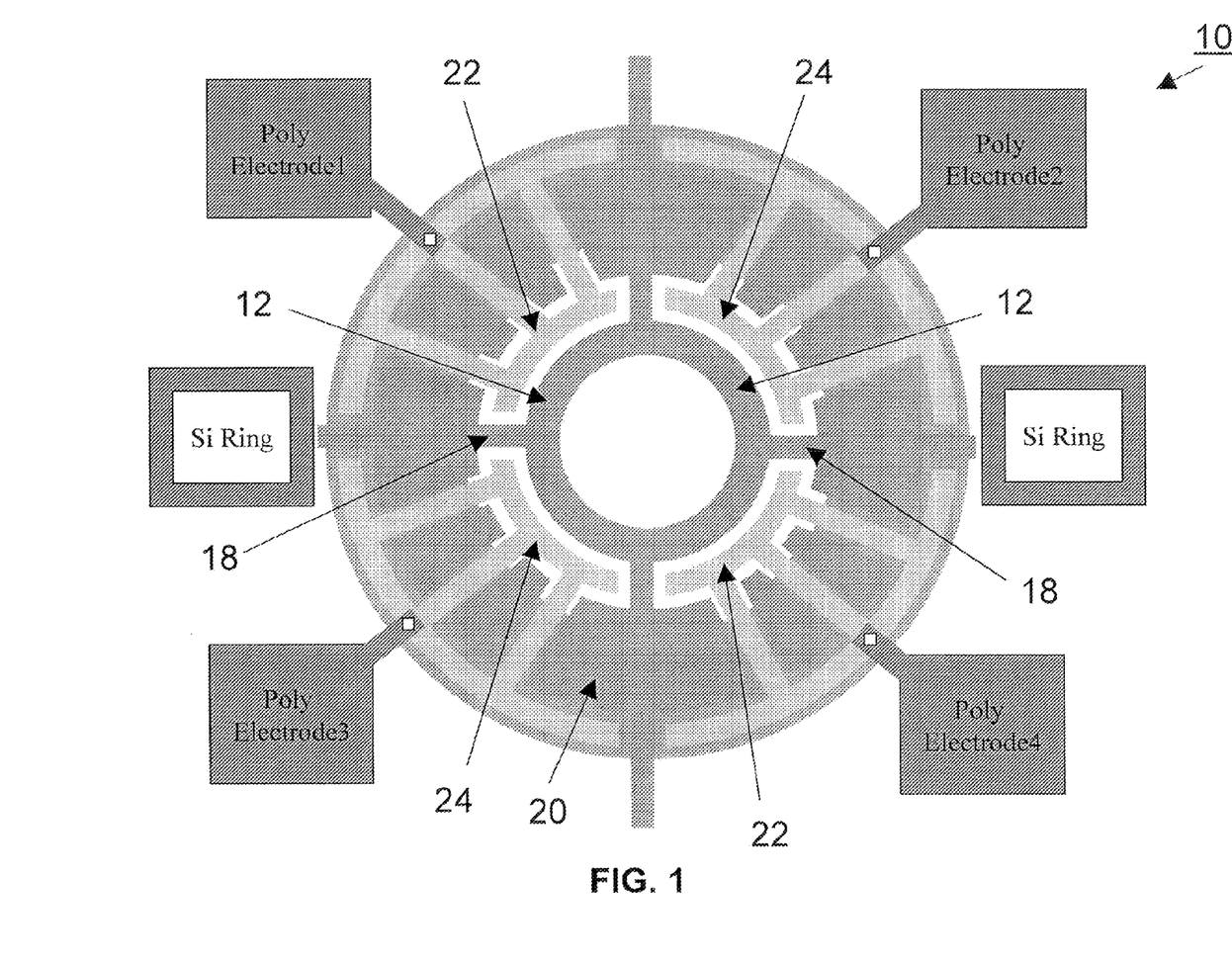
FIG. 1 schematically shows a plan view of an illustrative MEMS resonator produced in accordance with illustrative embodiments of the invention.
Figure 2:
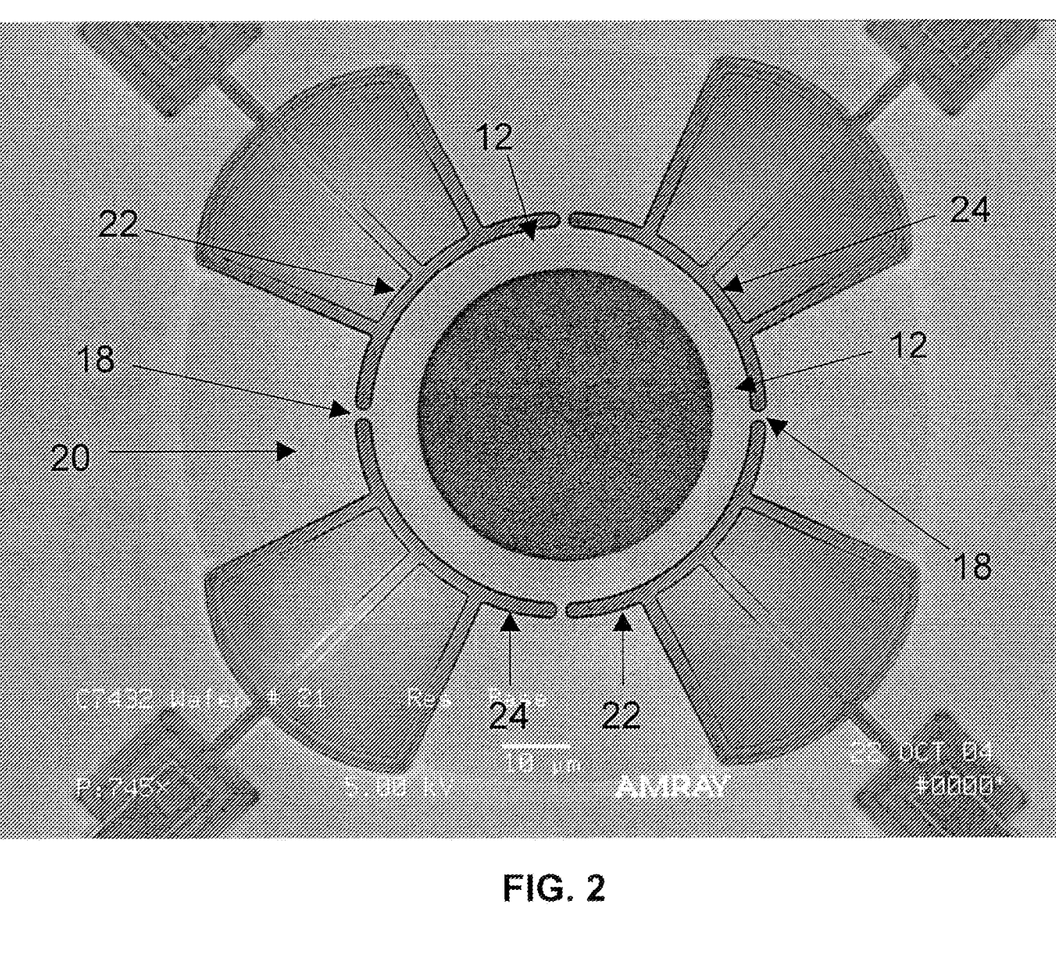
FIG. 2 shows a scanning electron micrograph of an illustrative MEMS resonator produced in accordance with illustrative embodiments of the invention.

FIG. 1 schematically shows a plan view and FIG. 2 shows a scanning electron micrograph of an illustrative resonator 10 produced in accordance with one embodiment of the invention. The resonator 10 has a resonating element 12 coupled to a plurality of anchors 18. The resonating element 12 may have any geometric shape, e.g., a ring or toroidal shape. The anchors 18 secure the resonating element 12 to a silicon substrate 20 to provide structural support. To provide symmetry, the plurality of anchors 18 are equally spaced about the resonating element 12 (e.g., about ninety degrees apart from one another). Although FIGS. 1 and 2 show four anchors 18 spaced around the resonating element 12, discussion of the specific locations and the number of anchors 18 is illustrative and not intended to limit the scope of all embodiments.

The resonator 10 also has a plurality of electrodes 22 and 24 to provide actuation and detection functionality to the resonating element 12. More particularly, the plurality of electrodes 22 and 24 may include a first set of two actuation electrodes 22 for generating electrostatic signals that cause the resonating element 12 to resonate, and a second set of two detection electrodes 24 that detect movement of the resonating element 12. The four electrodes 22 and 24 illustratively are equally spaced about the resonating element 12. Again, however, in a manner similar to the anchors 18, various embodiments may have different numbers, configurations and spacing of the electrodes 22 and 24.

The actuation electrodes 22 receive input signals and responsively generate electrostatic forces that cause the resonating element 12 to resonate. For example, upon receipt of an input signal, the actuation electrodes 22 may generate positive forces (e.g., a positive potential). The portions of the resonating element 12 nearest the actuation electrodes 22 may consequently flex inwardly in response to receipt of the positive electrostatic forces. In response to this mechanical deformation, other parts of the resonating element 12 may flex outwardly. After the actuation electrodes 22 generate the positive electrostatic force, the mechanical restorative forces of the resonating element 12 cause the resonating element 12 to flex outwardly at its points nearest the actuation electrodes 22. Other points, however, may flex inwardly in a corresponding manner. The actuation electrodes 22 continue to generate the noted forces in a periodic manner.

In a corresponding manner, the detection electrodes 24 each form a variable capacitor with the resonating element 12. As the resonating element 12 moves relative to the detection electrodes 24, the capacitance between each detection electrode 24 and the resonating element 12 changes because the distance between the effective capacitor plates changes as the resonating element 12 flexes. Circuitry (not shown) coupled with the detection electrodes 24 detects and converts any capacitance change into output signals that may be further processed. For example, the output signal may be a clock signal that essentially is a periodic signal filtered from a plurality of signals having different frequencies. Thus, the resonator 10 may be used to filter a desired signal from an input signal having interfering signals at other frequencies. As another example, the output signal may be a clock signal that acts as a clock within a computer system.

The resonating element 12 typically resonates in response to signals having the same frequency as its resonant frequency, which is a function of its geometry and material properties. Consequently, receipt of a signal not at the resonator 10 resonant frequency may have no more than a negligible effect on the resonating element 12. In other words, receipt of such a signal should not cause the resonating element 12 to resonate.

The resonator 10 discussed above is illustrative and thus, other resonators produced in accordance with processes discussed below may be produced as discussed herein. For example, other embodiments may use a resonator having a resonating element and another element between the electrodes and the resonating element, such as discussed in co-pending U.S. patent application entitled, "MEMS RESONATOR," filed on the same day herein, also naming Jason W. Weigold as inventor, the disclosure of which is incorporated herein, in its entirety, by reference.

Figure 3:
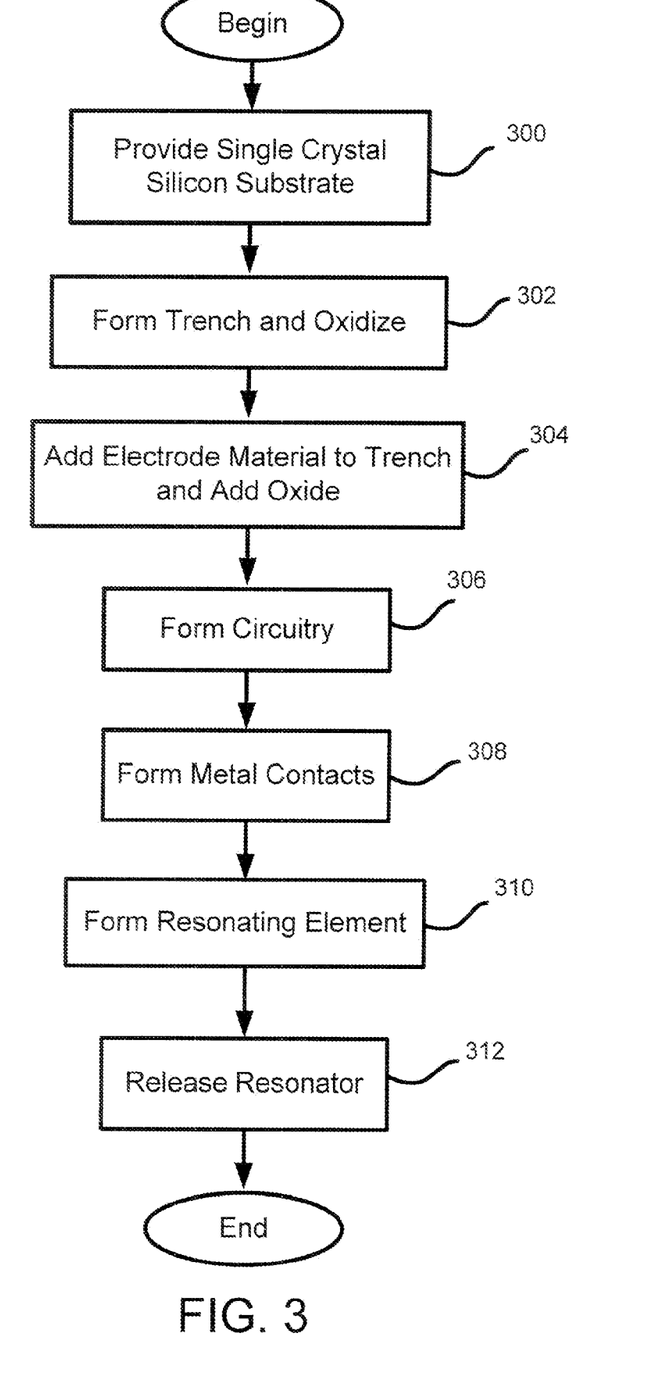
FIG. 3 shows a process of forming an integrated MEMS resonator in accordance with illustrative embodiments of the invention.

FIG. 3 schematically shows a process of forming an integrated MEMS resonator in accordance with illustrative embodiments of the invention. FIGS. 4A-4J schematically show a plurality of cross-sectional views of a resonator during the production process at certain steps discussed in FIG. 3.

This process does not describe all steps required for forming the integrated resonator. Instead, the process shows various relevant steps for forming the integrated resonator. Accordingly, some steps are not described and discussed.

The process begins at step 300, which provides a single crystal silicon substrate. The substrate may be formed from a single crystal silicon wafer or may be formed from a silicon-on-insulator ("SOI") wafer. As known by those in the art and shown in FIG. 4A, an SOI wafer has an insulator layer 26 (e.g., an oxide) between two single crystal silicon layers 30.

Figure 4A:
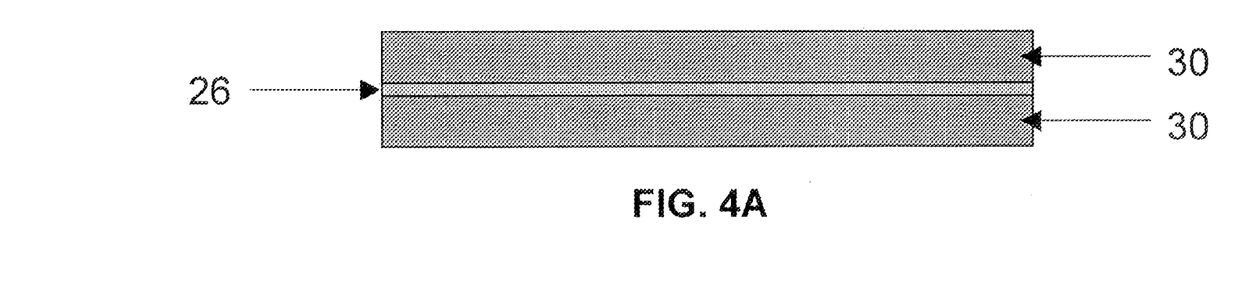
FIG. 4A schematically shows a cross-sectional view of a substrate during a stage of the process shown in FIG. 3 in accordance with illustrative embodiments of the invention.
Figure 4B:
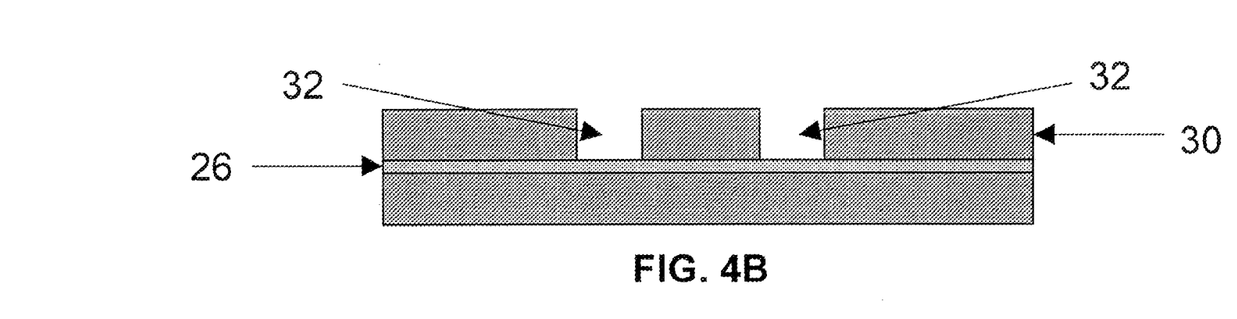
FIG. 4B schematically shows a cross-sectional view of trenches formed during a stage of the process shown in FIG. 3 in accordance with illustrative embodiments of the invention.
Figure 4C:
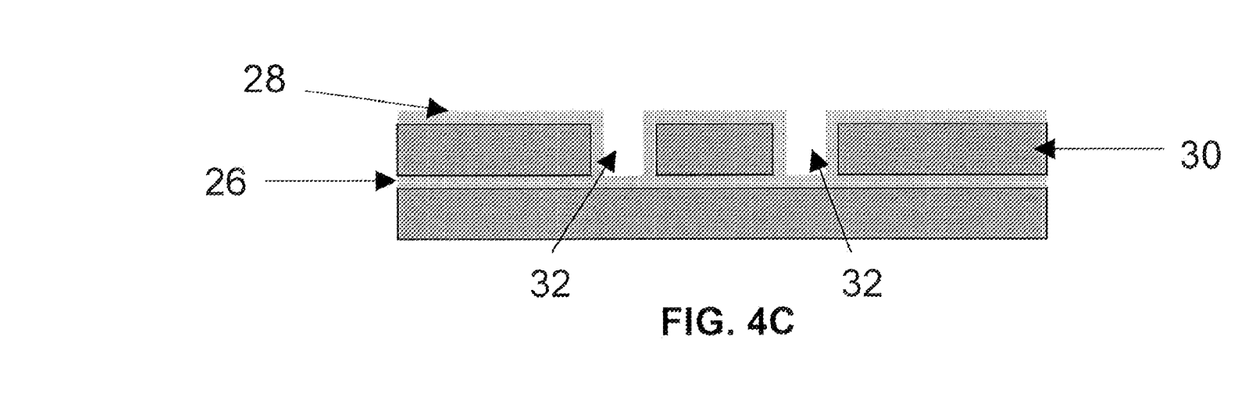
FIG. 4C schematically shows a cross-sectional view of oxide formed during a stage of the process shown in FIG. 3 in accordance with illustrative embodiments of the invention.
Figure 4D:
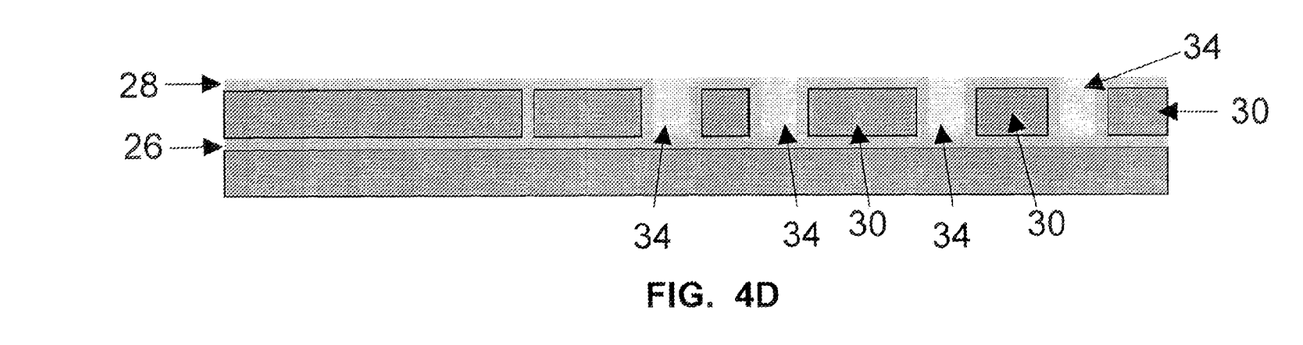
FIG. 4D schematically shows a cross-sectional view of polysilicon in the trenches during a stage of the process shown in FIG. 3 in accordance with illustrative embodiments of the invention.
Figure 4E:
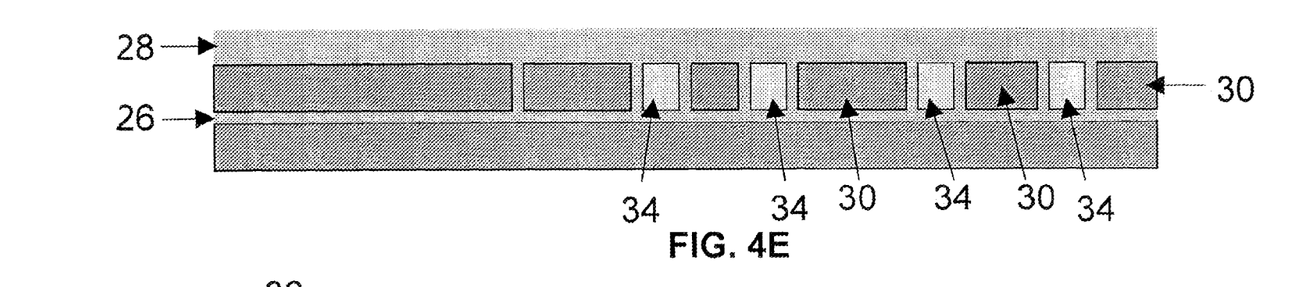
FIG. 4E schematically shows a cross-sectional view of oxide formed over the polysilicon during a stage of the process shown in FIG. 3 in accordance with illustrative embodiments of the invention.

In step 302, trenches 32 may be formed in the top layer of silicon 30 (FIG. 4B) using processes well known to those skilled in the art, e.g., using photolithography and etching techniques. An oxide layer 28 may then be formed on the walls of the trenches 32, along with other exposed surfaces, such as the bottom of the trenches 32 and the top surface of the top layer of silicon 30 (FIG. 4C). For example, the oxide layer 28 may be grown or deposited. In step 304, polysilicon 34 is added to the oxide lined trenches 32 (FIG. 4D). A top portion of the polysilicon 34 may then be removed along with the oxide layer 28 on the top layer of silicon 30, e.g., using etching techniques such as a chemical mechanical process, so that the top surface of the polysilicon 34 is substantially the same level or height as the surrounding silicon 30. An additional oxide layer 28 may then be added in selected areas over the resonator structure (e.g., around the etched and polysilicon areas) or over the entire wafer (FIG. 4E).

Figure 4F:
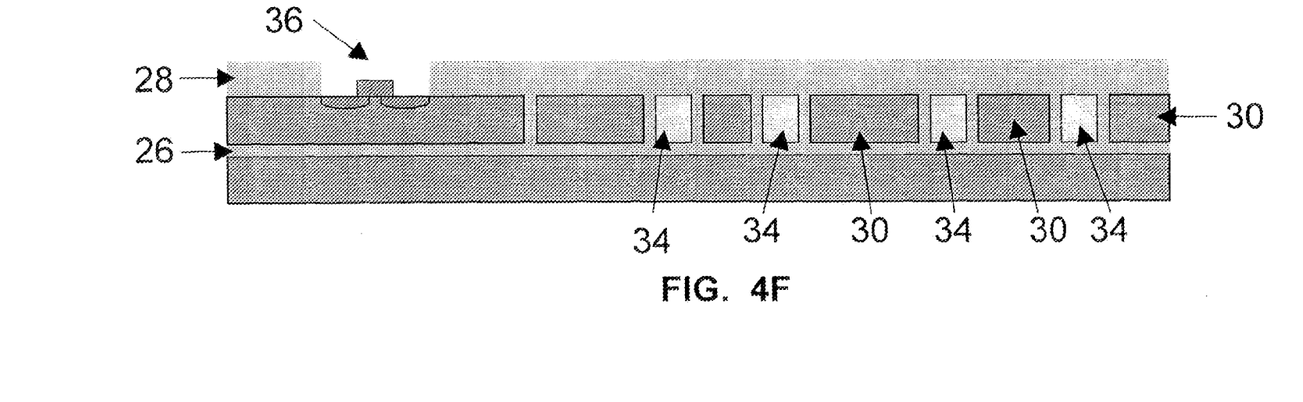
FIG. 4F schematically shows a cross-sectional view of circuitry formed during a stage of the process shown in FIG. 3 in accordance with illustrative embodiments of the invention.

In step 306, circuitry 36 may be formed in a conventional manner in selected areas where the oxide 28 was not formed, as noted in the previous step 304, or where the oxide 28 has been subsequently removed (FIG. 4F). Although the circuitry 36 is schematically shown adjacent to the resonator structure in FIG. 4F, the circuitry 36 may be located at any convenient location on the wafer or die. Also, various kinds and configurations of circuitry 36 may be formed in and/or on the silicon 30 wafer or die. In addition, circuitry 36 may be formed at a later stage of the process. However, circuitry 36 is preferably formed at a time when no subsequent high temperature processes are to be subsequently performed. Such timing is advantageous to help ensure the integrity of the circuitry 36, which may become damaged at such high temperatures.

Various embodiments therefore consider a process to be a "high temperature" process, or a "low temperature" process depending on the ability of the circuitry 36 to withstand certain temperatures. Specifically, if processes (e.g., deposition, etch, anneal) are normally performed at a specific temperature or temperature range, (both referred to simply as "temperature") and that temperature is known to present a significant risk of damaging the specific circuitry 36 in issue while the temperature is at such level, then the process is considered to be a "high temperature" process.

For example, if the junctions and metal traces of certain active circuitry 36 are able to withstand temperatures of up to 400 degrees C. for the time required to perform a specific process, then a process performed approximately at or above 400 degrees C is considered to be "high temperature" process for that particular circuitry 36. In this case, the deposition of polysilicon may be considered a high temperature process. Similarly, using this example, processes performed below 400 degrees C. are considered to be "low temperature" processes. Nevertheless, discussion of 400 degrees C. is exemplary and not intended to limit various embodiments. Accordingly, in summary, the process temperature and its impact on the specific circuitry 36 determine whether a process is a "high temperature" or "low temperature" process.

As is well known to those skilled in the art, a number of methods may be used for determining the capability of the circuitry 36 to withstand certain temperatures. For example, software modeling algorithms may be used to model the thermal cycling of the circuitry 36, e.g., effect of diffusion in doped areas, through the entire fabrication process. The circuitry 36 may also be subjected to the temperatures and then tested. Based on these or other techniques known by those in the art, an appropriate process temperature or temperature range may be selected so that the circuitry 36 is formed or partially formed after the high temperature processes are performed.

Figure 4G:
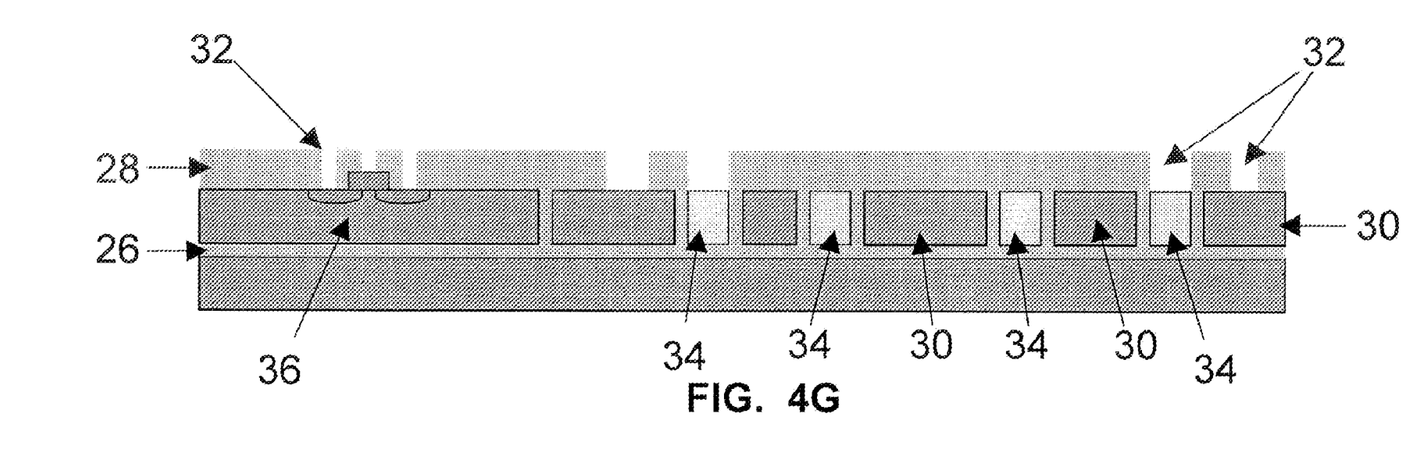
FIG. 4G schematically shows a cross-sectional view of trenches formed during a stage of the process shown in FIG. 3 in accordance with illustrative embodiments of the invention.
Figure 4H:
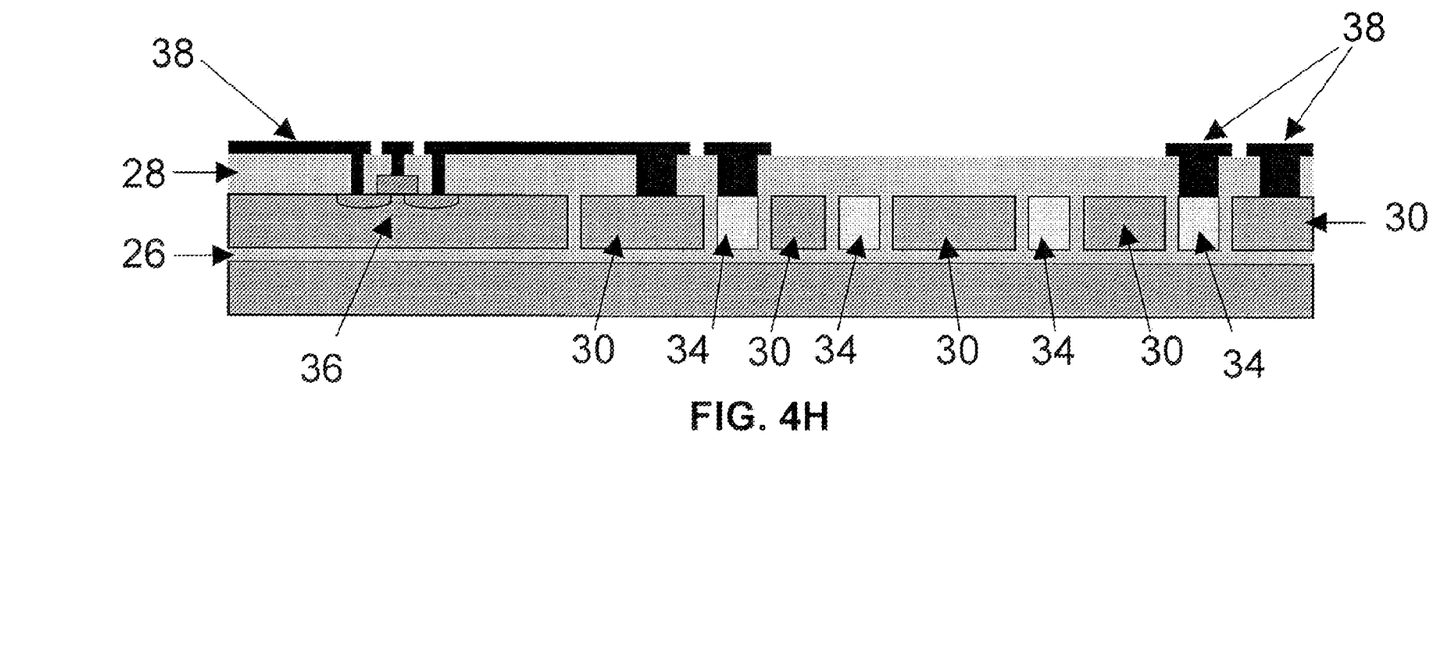
FIG. 4H schematically shows a cross-sectional view of metal contacts formed during a stage of the process shown in FIG. 3 in accordance with illustrative embodiments of the invention.
Figure 4I:
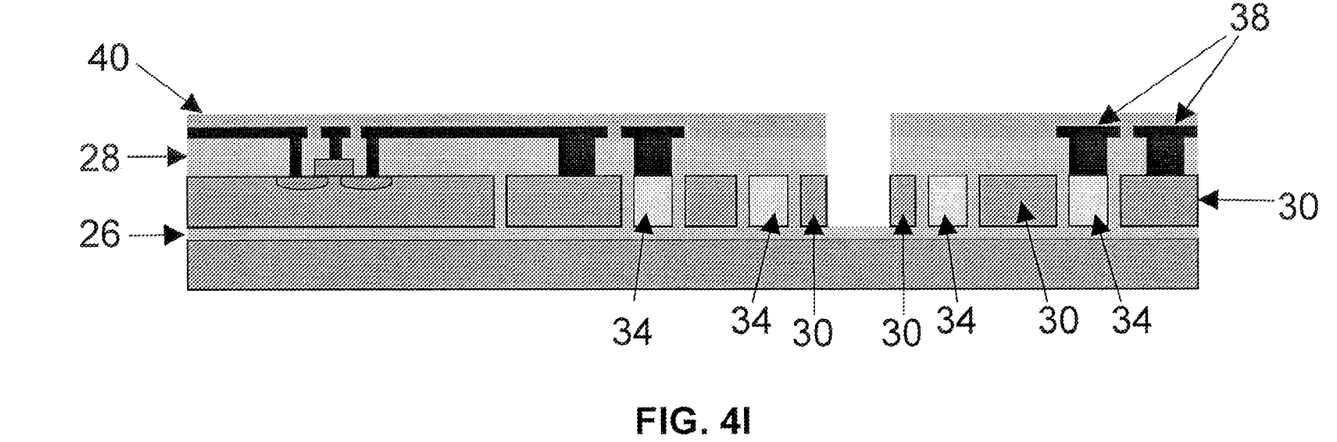
FIG. 4I schematically shows a cross-sectional view of resonating element formed during a stage of the process shown in FIG. 3 in accordance with illustrative embodiments of the invention.
Figure 4J:
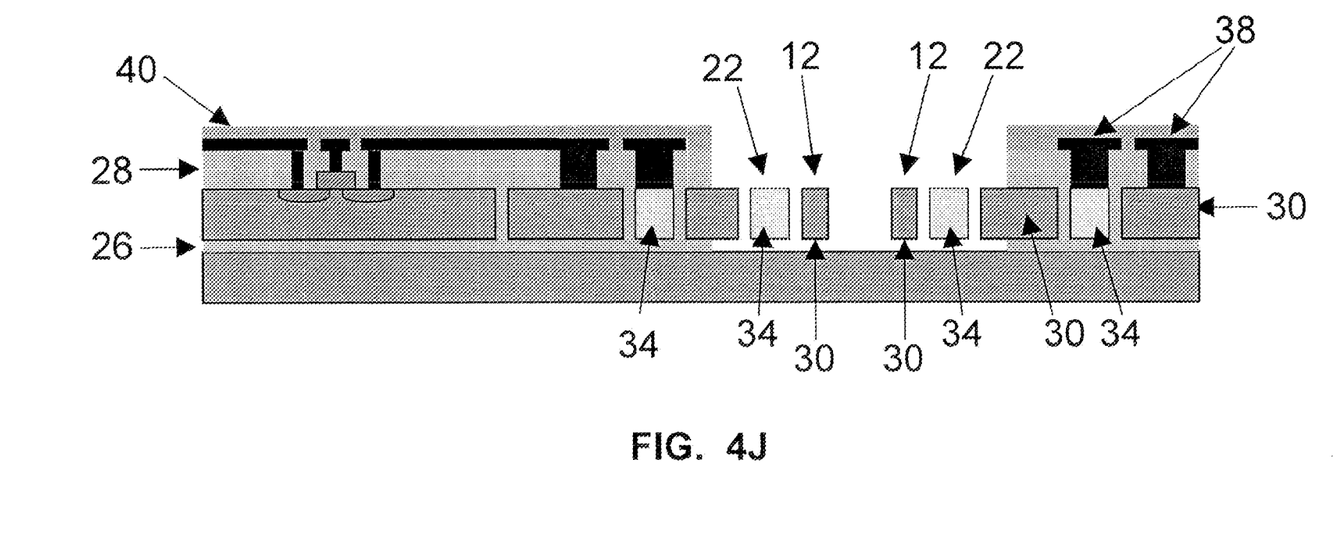
FIG. 4J schematically shows a cross-sectional view of release of the resonator during a stage of the process shown in FIG. 3 in accordance with illustrative embodiments of the invention.

Returning to the process, additional oxide 28 may be formed over the circuitry 36 and trenches 32 may be formed into the oxide 28 to expose a portion of the circuitry 36, selected areas in the top layer of silicon 30 and a portion of the polysilicon 34, as shown in FIG. 4G. In step 308, metal contacts 38 may be formed in and around the exposed, removed areas and along selected areas of the oxide 28 (FIG. 4H) to provide an electrical contact and interface with the exposed areas. In step 310, a portion of the oxide 28 and the top layer of silicon 30 may be removed, thereby forming the inner diameter of the resonating element 12 in the resonator structure 10 (FIG. 4I). For example, photoresist 40 may be formed over the surface of the wafer or die. Then, using standard photolithography techniques, the photoresist 40 may be patterned and removed in selected areas to expose the underlying oxide 28. The oxide 28 may then be removed using a wet, chemical etch process (e.g., hydrofluoric acid) and the silicon 30 may be removed using a dry, plasma etch process that may use chemicals (e.g., xenon difluoride). Other removal processes may also be used as well known to those skilled in the art.

After etching the silicon 30 in the top layer of the substrate, the process releases a portion of the resonator 10 in step 312 (FIG. 4J), enabling the resonating element 12 to resonate when actuated. For example, the photoresist 40 may be patterned and removed in a larger area around the area etched in step 310 to expose the underlying oxide 28. The oxide 28 may then be removed between some of the silicon 30 and the polysilicon 34, to form the electrostatic gaps between the resonating element 12 and the electrodes 22, 24, and between a portion of the electrodes 22, 24 and the silicon substrate 20. The oxide 28 may also be removed underneath a portion of the silicon 30 and the polysilicon 34, to release the resonating element 12 and a portion of the polysilicon electrodes 22, 24. The oxide 28 may be removed using a wet, chemical etching process, such as hydrofluoric acid, although other removal processes may be used. Other processing steps may also be performed before, during, and/or after the discussed processing steps. Such steps, if performed, have been omitted for simplicity. The order of the processing steps may also be varied and/or combined. For example, step 310 (removing a portion of the substrate 30) may be performed during step 302 (formed trenches in the substrate 30). However, as mentioned above, the circuitry 36 is preferably formed or partially formed after the high temperature processes have been performed.

Other processing steps may be taken to complete production of the integrated resonator. For example, if done in a batch process, the wafer may be diced to form a plurality of individual dies. When discussing various processes, the terms "wafer" and "die" may be used interchangeably, although a wafer may form a plurality of individual dies. Some embodiments may implement post-processing methods for integrating the resonator 10 with circuitry 36 on a die that already has additional circuitry.

As mentioned, the resonator 10 shown and discussed is exemplary. Thus, embodiments may vary from the process shown and discussed above. For example, the substrate may comprise a bulk silicon wafer and a top layer of the silicon may be doped to provide two compositionally different layers within the bulk silicon. Then, rather than the trenches 32 formed through the top layer of silicon 30 and stopping at the insulator layer 26, as discussed above, the trenches 32 may be formed through the top layer of doped silicon and stop at the undoped silicon substrate. Similarly, the electrostatic gaps between the resonating element 12 and the electrodes 22, 24 may be formed by etching (e.g., using a dry, plasma etch process) a space or removing material between the substrate 30 and the polysilicon 34 rather than using the oxide 28 and its subsequent removal to form the electrostatic gaps. Various embodiments may also produce resonators having a resonating element and another element between the electrodes and the resonating element, such as those taught in the above referenced co-pending U.S. patent application.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a MEMS resonator, the method comprising:
   providing a substrate comprising single crystal silicon;
   before fabricating circuitry, forming an electrode in a first portion of the substrate;
   after forming the electrode, fabricating the circuitry on a second portion of the substrate; and
   after fabricating the circuitry, forming a resonating element from a portion of the substrate, the resonating element adjacent to the electrode, the electrode and the resonating element forming a variable capacitor, the resonating element configured to move relative to the electrode, the circuitry being in communication with the electrode for detecting capacitance of the variable capacitor, one portion of the circuitry formed in a top layer of the substrate, the top layer substantially co-planar with the resonating element.

2. The method of claim 1, wherein the substrate is a silicon-on-insulator wafer.

3. The method of claim 1, wherein high temperature processes at least in part form the electrode and fabricating circuitry is performed after the high temperature processes of forming the electrode.

4. The method of claim 1, wherein the electrode is formed from polysilicon.

5. A method of forming a MEMS resonator, the method comprising:
   providing a substrate comprising single crystal silicon;
   forming a trench in a first portion of the substrate;
   adding material to the trench to form an electrode of the resonator;
   after forming the electrode, forming circuitry on a second portion of the substrate;
   after forming the circuitry, forming metal contacts to the circuitry, the material, and the substrate;
   after forming the metal contacts, forming a resonating element from a portion of the substrate, the resonating element configured to move relative to the electrode, one portion of the circuitry formed in a top layer of the substrate, the top layer substantially co-planar with the resonating element; and
   after forming the resonating element, releasing the resonating element and a portion of the electrode from the substrate.

6. The method of claim 5 further comprising forming oxide along surfaces of the trench before adding the material to the trench.

7. The method of claim 6, wherein releasing the resonating element includes removing the oxide between the resonating element and the electrode to form an electrostatic gap.

8. The method of claim 5, wherein the substrate is a silicon-on-insulator wafer.

9. The method of claim 5, wherein forming a resonating element is performed contemporaneously with forming the trench.

10. The method of claim 5, further comprising etching a space between the material and the substrate to form electrostatic gaps between the resonating element and the electrode.

11. The method of claim 5, wherein forming a resonating element includes removing a portion of the substrate to form an outer diameter of the resonating element in the same step as removing a portion of the substrate to form an inner diameter of the resonating element.

* * * * *